(12) United States Patent
Wu et al.

(10) Patent No.: US 7,626,160 B2
(45) Date of Patent: Dec. 1, 2009

(54) IMAGE SENSING MODULE WITH IMPROVED ASSEMBLY PRECISION

(75) Inventors: Ying-Cheng Wu, Miao-Li Hsien (TW); Chun-Hung Lin, Miao-Li Hsien (TW)

(73) Assignee: Altus Technology Inc., Chu-Nan, Miao-Li Hsien (TW)

( * ) Notice: Subject to any disclaimer, the term of this patent is extended or adjusted under 35 U.S.C. 154(b) by 370 days.

(21) Appl. No.: 11/617,627

(22) Filed: Dec. 28, 2006

(65) Prior Publication Data

US 2008/0105819 A1 May 8, 2008

(30) Foreign Application Priority Data

Nov. 3, 2006 (CN) .......................... 2006 1 0063463

(51) Int. Cl.
   *H01J 40/14* (2006.01)
(52) U.S. Cl. ........................................ 250/239; 257/434
(58) Field of Classification Search ................. 250/239; 257/433, 434, 678, 680; 438/64; 348/340
   See application file for complete search history.

(56) References Cited

U.S. PATENT DOCUMENTS

| | | | |
|---|---|---|---|
| 5,865,935 A | 2/1999 | Ozimek et al. | |
| 6,727,431 B2 * | 4/2004 | Hashimoto | 174/539 |
| 6,934,065 B2 | 8/2005 | Kinsman | |
| 7,084,391 B1 * | 8/2006 | Chen | 250/239 |
| 2004/0089906 A1 * | 5/2004 | Hsin | 257/433 |
| 2006/0093352 A1 | 5/2006 | Webster et al. | |
| 2007/0090505 A1 * | 4/2007 | Kikuchi | 257/680 |

FOREIGN PATENT DOCUMENTS

CN   1553512 A   12/2004

\* cited by examiner

*Primary Examiner*—Thanh X Luu
(74) *Attorney, Agent, or Firm*—Zhigang Ma

(57) ABSTRACT

An image sensor package (110) includes a base board (111), a supporter (113), an image sensor (112), a plurality of wires (114), a main adhesive (115) and a cover board (116). The supporter includes a through hole and a plurality of top pads (113c) formed around the through hole, and the supporter is mounted on the base board and electrically connected to the base board. The image sensor is mounted on the base board and received in the through hole, and the image sensor includes a sensing portion (112b) and a plurality of contacts (112a). The wires electrically connect the top pads to the contacts. The main adhesive is applied on the image sensor and surrounds the sensing portion. The cover board supported on the main adhesive, and the cover board and the main adhesive cooperatively enclose the sensing portion of the image sensor.

6 Claims, 6 Drawing Sheets

IMAGE SENSING MODULE WITH IMPROVED ASSEMBLY PRECISION

BACKGROUND OF THE INVENTION

1. Field of the Invention

The present invention generally relates to image sensor packages and image sensing modules and, more particularly, to a miniaturized image sensor package and an image sensing module using the image sensor package, or such like.

2. Description of Related Art

With the ongoing development of microcircuitry and multimedia technologies, digital cameras are now in widespread use. High-end portable electronic devices, such as mobile phones and personal digital assistants (PDAs), are being developed to be increasingly multi-functional. Many of these portable electronic devices are now equipped with a digital camera module. At the same time, the need for digital picture quality has become greater and greater.

In a digital camera, an image sensing module including an image sensor package is very important to determine the quality of the pictures captured by the digital camera. Referring to FIG. 6, a widely used typical image sensor package 600 includes a base board 10, an image sensor 20, a plurality of wires 23, a first adhesive 30, a second adhesive 40 and a top board 50. The base board 10 includes a base plate 11, a peripheral portion of the base plate 11 extends along a same direction and forms a sidewall 12, and the base plate 11 and the sidewall 12 cooperatively to define a receiving cavity 13 therebetween. A plurality of contacts 14 are arranged on a first surface (not labeled) towards the top board 50 of the base plate 11, and a plurality of contacts 16 are formed on a second surface (not labeled) positioned opposite to the first surface of the base plate 11. Each contact 14 is electrically connected to a corresponding contact 16 via a respective conductor member 15 integrated with the base plate 11.

The image sensor 20 is received in the receiving groove 13, and is secured on the base plate 11 via the first adhesive 30. A sensing portion 21 is formed on a surface of the image sensor 20. A plurality of pads 22 are formed around the sensing portion 21, and the pads 22 are connected to the contacts 14 via the wires 23. The first adhesive 30 is applied to a surface of the base plate 11 around the image sensor 20, and covers the pads 22, the wires 23 and the contacts 14. The top board 50 is mounted on a top of the sidewall 12 via the second adhesive 40.

Generally, image sensing modules should be of small size for reducing volume and cost of digital cameras. However, in the image sensor package 600, the sidewall 12 is formed on the base board 10 to define the receiving cave 13 for receiving the image sensor 20. Therefore the base board 10 must be made of hard materials and thus is more expensive. Additionally, the base board 10 including the base plate 11 and the sidewall 12 has a large volume, and correspondingly needs more cost. As a result, an image sensing module or a digital camera using the image sensor package 600 also has a large volume. On the other hand, the sidewall 12 may interfere with mounting the image sensor 20 on the base board 11.

Therefore, an improved image sensor package and an image sensing module using the package are desired in order to overcome the above-described shortcomings.

SUMMARY OF THE INVENTION

In one aspect, an image sensor package includes a base board, a supporter, an image sensor, a plurality of wires, a main adhesive and a cover board. The supporter includes a through hole and a plurality of top pads formed around the through hole, and the supporter is mounted on the base board and electrically connected to the base board. The image sensor is mounted on the base board and received in the through hole, and the image sensor includes a sensing portion and a plurality of contacts. The wires electrically connect the top pads to the contacts. The main adhesive is applied on the image sensor and surrounds the sensing portion. The cover board supported on the main adhesive, and the cover board and the main adhesive cooperatively enclose the sensing portion of the image sensor.

In another aspect, an image sensing module includes an image sensor package and a lens module. The image sensor package includes a base board, a supporter, an image sensor, a plurality of wires, a main adhesive and a cover board. The supporter includes a through hole and a plurality of top pads formed around the through hole, and the supporter is mounted on the base board and electrically connected to the base board. The image sensor is mounted on the base board and received in the through hole, and the image sensor includes a sensing portion and a plurality of contacts. The wires electrically connect the top pads to the contacts. The main adhesive is formed on the image sensor, and the cover board and the main adhesive cooperatively package the sensing portion of the image sensor. The lens module is connected to the image sensor package.

Other advantages and novel features will become more apparent from the following detailed description when taken in conjunction with the accompanying drawings.

BRIEF DESCRIPTION OF THE DRAWINGS

Many aspects of the present invention can be better understood with reference to the following drawings. The components in the drawings are not necessarily drawn to scale, the emphasis instead being placed upon clearly illustrating the principles of the present invention. Moreover, in the drawings, like reference numerals designate corresponding parts through-out the several views.

DETAILED DESCRIPTION OF THE INVENTION

Figure 1:
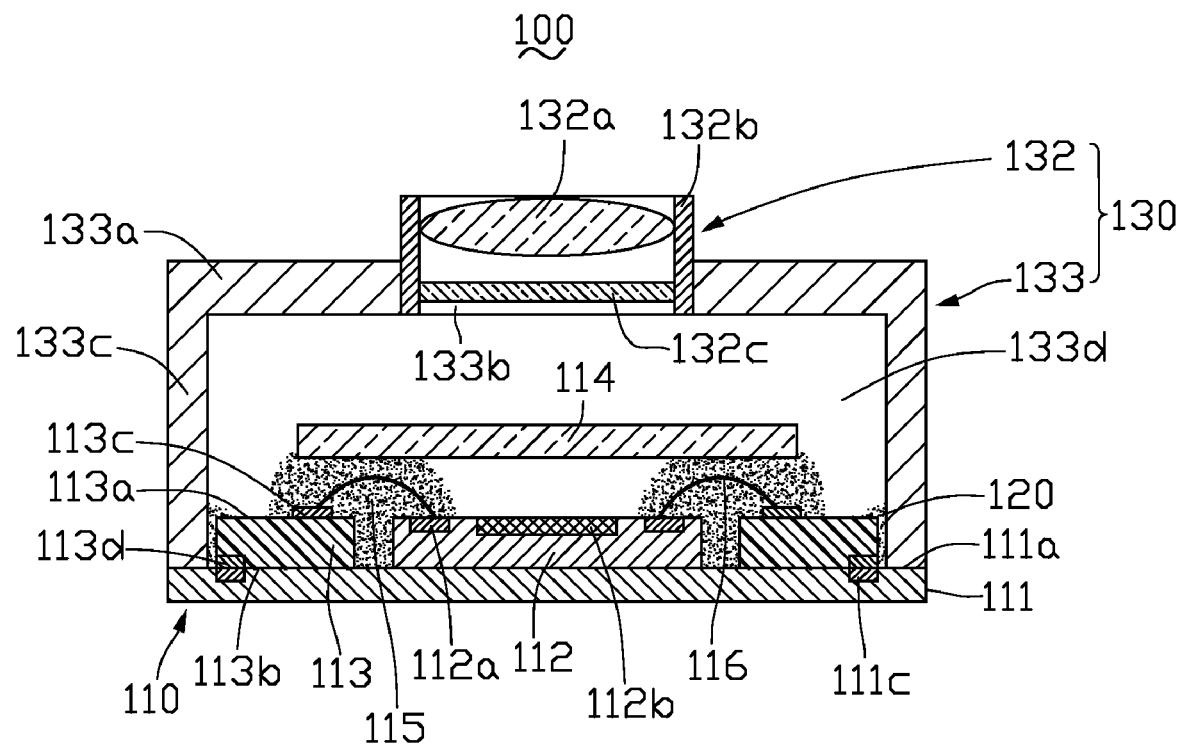
FIG. 1 is schematic, cross-sectional view of an image sensing module in accordance with a first preferred embodiment of the present invention.

Referring now to the drawings in detail, FIG. 1 shows an image sensing module 100 in accordance with a first preferred embodiment of the present invention. The image sensing module 100 includes an image sensor package 110, a subsidiary adhesive 120 and a lens module 130. The lens module 130 includes a lens group 132 and a lens holder 133, the lens group 132 is mounted on the lens holder 133, and the lens holder 133 is mounted to the image sensor package 110 via the subsidiary adhesive 120.

The image sensor package 110 includes a base board 111, an image sensor 112, a supporter 113, a cover board 114, a main adhesive 115 and a plurality of wires 116. The base board 111 can be made of polyimide (PI) or polyethylene terephthalate (PET), and has a thickness of not more than 5 mm. The base board includes a top surface 111a. A plurality of base pads 111c are formed on the top surface 111a.

The supporter 113 is a frame and includes a through hole (not labeled) defined therein. A dimension of the through hole is larger than that of the image sensor 112. The supporter 113 includes a top surface 113a and a bottom surface 113b positioned on an opposite side to the top surface 113a. A plurality of top pads 113c are formed around the through hole on the top surface 113a, and a plurality of bottom pads 113d are formed on the bottom surface 113b. Each top pad 113c is electrically connected to a bottom pad 113d. The supporter 113 is mounted on the top surface 111a of the base board 111. Each bottom pad 113d of the supporter 113 is electrically connected to a base pad 111c of the base board 111 via surface mount technology (SMT), hot bar or anisotropic conductive film (ACF).

The image sensor 112 is mounted on the top surface 111a of the base board 111 and is received in the hole of the supporter 113. A sensing portion 112b is formed on the image sensor 112, and a plurality of contacts 112a are formed around the sensing portion 112b. The wires 116 connect the contacts 112a and the top pads 113c, thus the image sensor 112 is connected to the base board 111 via the supporter 113. The main adhesive 115 is applied to the surface 111a of the base board 111, an outer periphery of a top surface of the image sensor 112 and an inner periphery the surface 113a of the supporter 113. The contacts 112a, the top pads 113c and the wires 116 are covered by the main adhesive 115. A thickness of the main adhesive 115 is larger than a height of each wire loop formed by the wires 116. The cover board 114 is a transparent plate. The cover board 114 is stacked above the image sensor 112 and is fixed to the main adhesive 115. The cover board 114 and the main adhesive 115 cooperatively package the sensing portion 112b of the image sensor 112.

The subsidiary adhesive 120 is applied to an outer periphery of the supporter 113 for fixing the lens holder 133 to the supporter 113. The lens group 132 includes at least one lens 132a, a barrel 132b and a filter 132c. The barrel 132b is a hollow cylinder in shape. The lens 132a and the filter 132c are mounted in the barrel 132b. The lens holder 133 includes a top board 133a, and a hole 133b is defined on a central portion of the top board 133a. A pedestal 133c is formed on a peripheral portion of the top board 133a. The top board 133a and the pedestal 133c cooperatively define a receiving space 133d. A dimension of the receiving space 133d is larger than that of the outer periphery of the supporter 113. The barrel 132b is received in the hole 133b. The pedestal 133c is attached to the supporter 113 of the image sensor package 110 via the subsidiary adhesive 120, wherein the image sensor 112 and the supporter 113 are received in the receiving space 133d. The lens 132a faces towards the sensing portion 112a of the image sensor 112 to form a focused image on the image sensor 112.

Understandably, the image sensor package 110 having a small thickness uses a thin type base board 111 thereby reducing the height of the image sensing module 100. The base board 111 does not have any protrusions, thus it is more easy to manufacture the base board 111 and mount the image sensor 112 on the base board 111. Additionally, the main adhesive 115 and the cover board 114 cooperatively form a relatively small space to package the sensing portion 112b of the image sensor 112. Thus, the space contains less dust and water vapor therein. Therefore, the pollution of the sensing portion 112b of the image sensor 112 is reduced, and quality of the image sensing module 100 is much improved.

Figure 2:
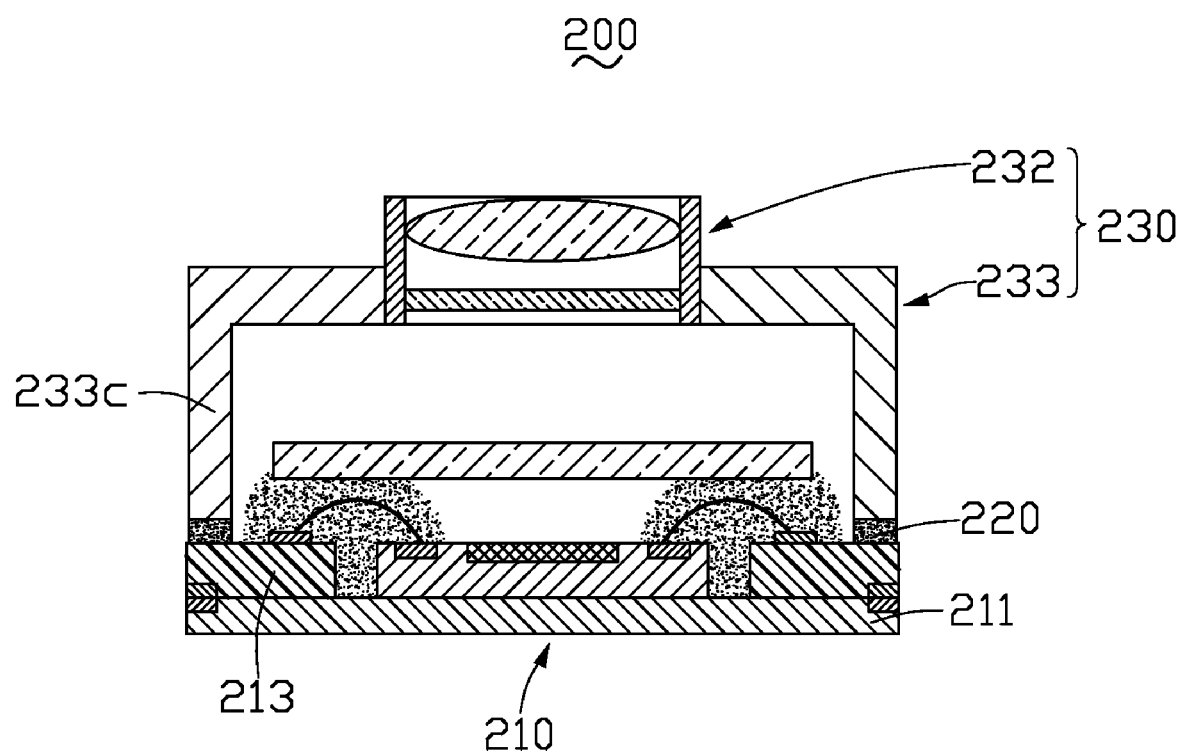
FIG. 2 is a schematic, cross-sectional view of an image sensing module in accordance with a second preferred embodiment of the present invention.

Referring to FIG. 2, an image sensing module 200 in accordance with a second preferred embodiment of the present invention is provided. The image sensing module 200 has a similar structure to the image sensing module 100, and includes an image sensor package 210, a subsidiary adhesive 220 and a lens module 230. The lens module includes a lens group 232 and a lens holder 233. The image sensor package 210 includes a supporter 213 and a base board 211. These components of the image sensing module 200 are similar to their corresponding components of the image sensing module 100. The image sensing module 200 differs from the image sensing module 100 primarily in the mounting of the lens holder 233.

The subsidiary adhesive 220 is applied to a peripheral portion of a top surface of the supporter 213. The lens holder 233 includes a pedestal 233c, a dimension of an outer periphery of the pedestal 233c is approximately equal to that of an outer periphery of the supporter 213 and an outer periphery of the base board 211. The pedestal 233c is fixed to the top surface of the supporter 213 via the subsidiary adhesive 220.

Understandably, the image sensing module 200 can reduce volume of the base board 211, the supporter 213 and the lens holder 233, thus volume and cost of the image sensing module 200 are also reduced.

Figure 3:
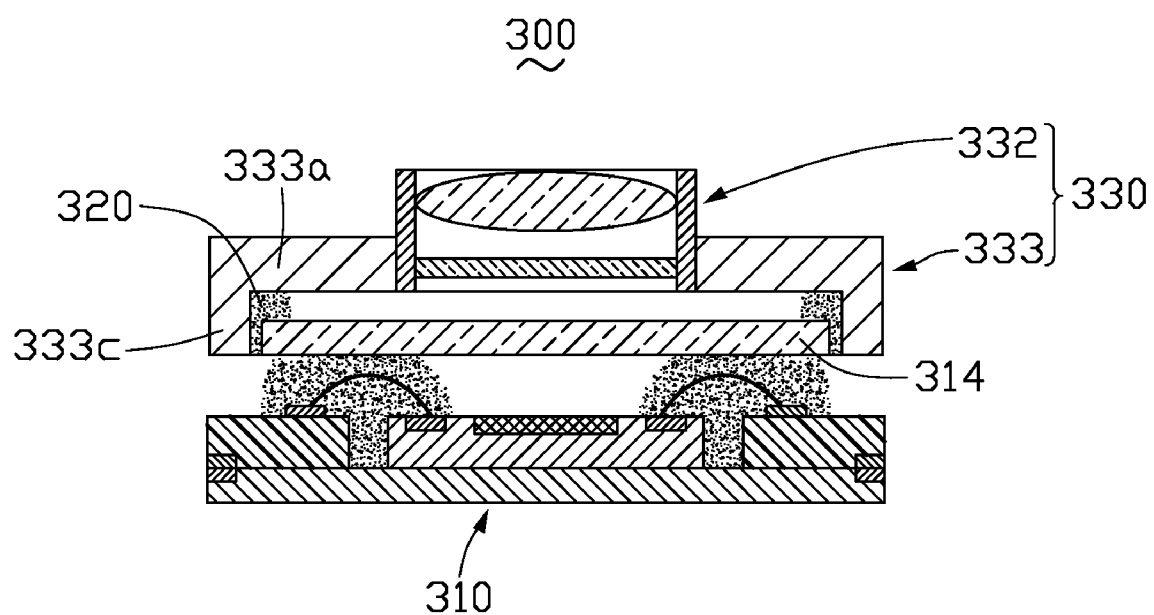
FIG. 3 a schematic, cross-sectional view of an image sensing module in accordance with a third preferred embodiment of the present invention.

Referring to FIG. 3, an image sensing module 300 in accordance with a third preferred embodiment of the present invention is provided. Similarly to the image sensing module 100, the image sensing module 300 includes an image sensor package 310, a subsidiary adhesive 320 and a lens module 330. The lens module includes a lens group 332 and a lens holder 333. The image sensor package 310 includes a cover board 314. These components of the image sensing module 300 are similar to their corresponding components of the image sensing module 100. The image sensing module 300 differs from the image sensing module 100 primarily in the mounting of the lens holder 333.

The lens holder 333 includes a top board 333a and a pedestal 333c. An inner periphery of the pedestal 333c is of approximately equal dimensions to an outer periphery of the cover board 314. The subsidiary adhesive 320 is formed on a peripheral portion of a surface of the cover board 314. The top board 333a and an inner surface of the pedestal 333c are connected to the cover board 314 via the subsidiary adhesive 320.

Understandably, in assembly of the image sensing module 300, only the cover board 314 is received in the pedestal 333c. In this way, volume of the lens holder 333 can be reduced, thus volume, weight and cost of the image sensing module 300 can also be reduced.

Figure 4:
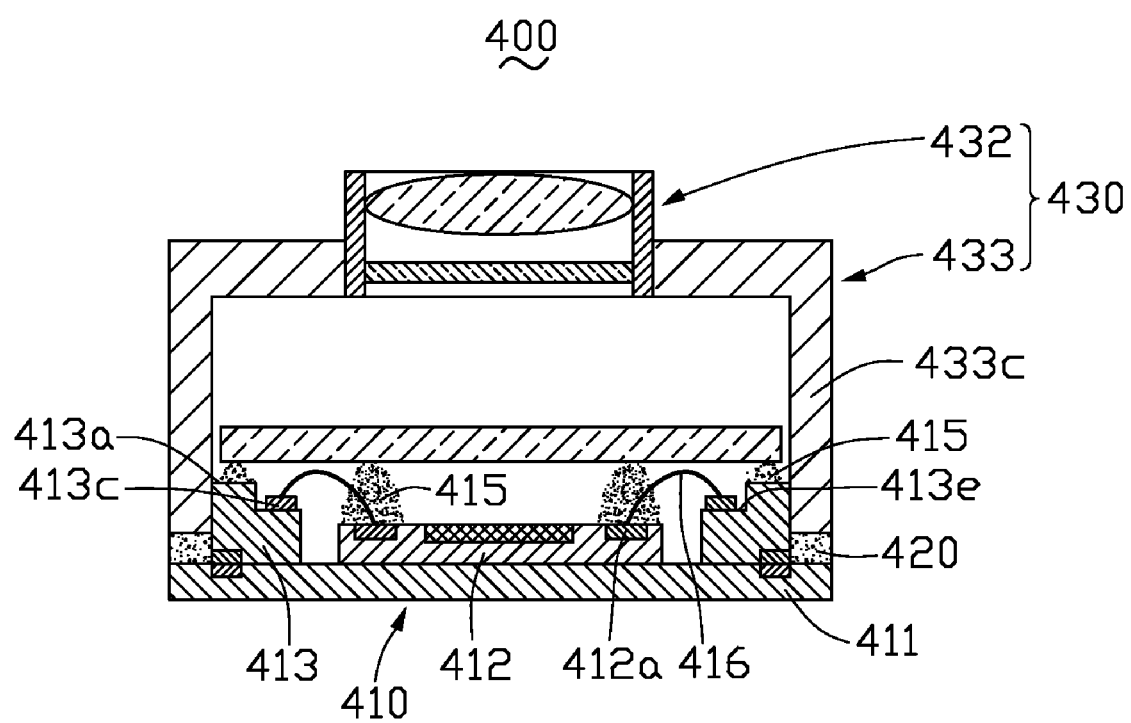
FIG. 4 a schematic, cross-sectional view of an image sensing module in accordance with a fourth preferred embodiment of the present invention.

Referring to FIG. 4, an image sensing module 400 in accordance with a fourth preferred embodiment of the present invention is provided. Similarly to the image sensing module 100, the image sensing module 400 includes an image sensor package 410, a subsidiary adhesive 420 and a lens module 430. The lens module includes a lens group 432 and a lens holder 433. The image sensor package 410 includes a base board 411, an image sensor 412, a supporter 413, a main adhesive 415 and a plurality of wires 416. These components of the image sensing module 400 are similar to their corresponding components of the image sensing module 100 respectively. The image sensing module 400 differs from the image sensing module 100 mainly in the structure of the supporter 413 and the way of mounting the lens holder 433.

A plurality of contacts 412a are formed on a periphery of the image sensor 412. The supporter 413 includes a top surface 413a and a stepped surface 413e, the stepped surface 413e is positioned near a central portion of the supporter 413 and lower than the top surface 413a. A plurality of top pads 413c are formed on the stepped surface 413e. The main adhesive 415 is formed on a peripheral portion of a top surface of the image sensor 412 and the top surface 413a of the supporter 413. A thickness of the main adhesive 415 is larger than a height of each wire loop formed by the wires 416. Additionally, the main adhesive 415 can also be applied to the wires 416 and the stepped surface 413e to cover the contacts 412a and top pads 413c.

The lens holder 433 includes a pedestal 433c, a dimension of an inner periphery of the pedestal 433c is approximately equal to an outer periphery of the supporter 413. The subsidiary adhesive 420 is applied to a peripheral portion of the base board 411. The pedestal 433c covers around the supporter 413, the inner surface of the pedestal 433c tightly contacts with the supporter 413. The pedestal 433c is mounted on the base board 411 via the subsidiary adhesive 420.

Understandably, in assembly of the image sensing module 400, the supporter 413 can cooperate with the pedestal 433c to improve precision of assembly of the image sensing module 400.

Figure 5:
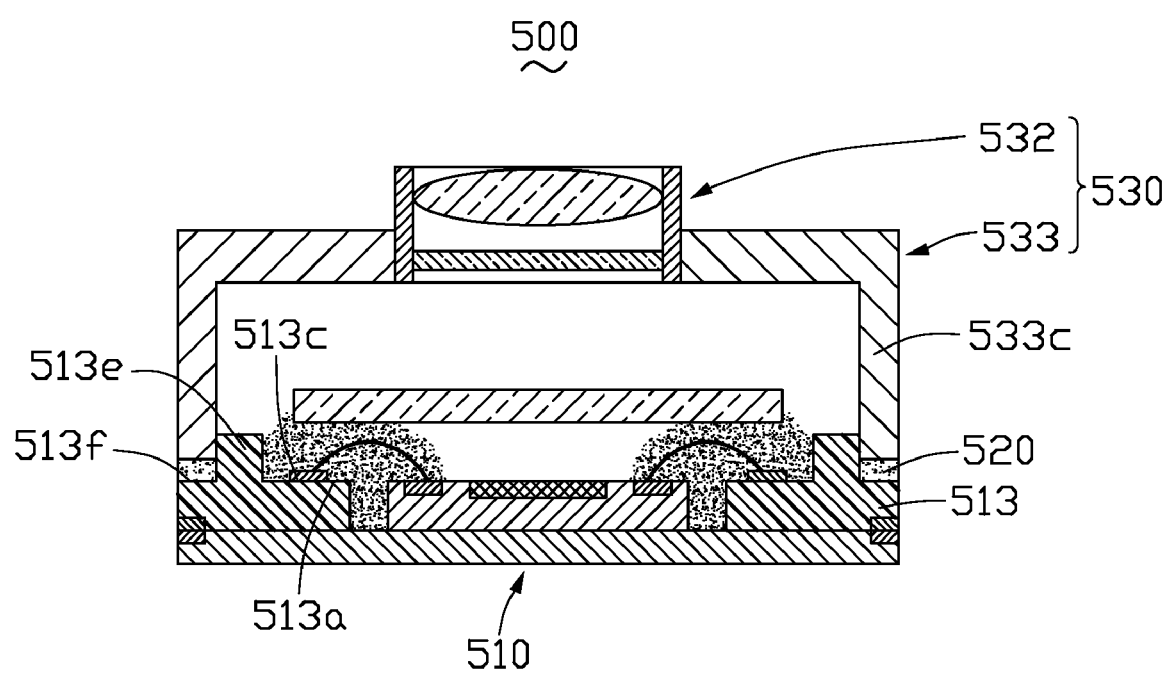
FIG. 5 a schematic, cross-sectional view of an image sensing module in accordance with a fifth preferred embodiment of the present invention.
Figure 6:
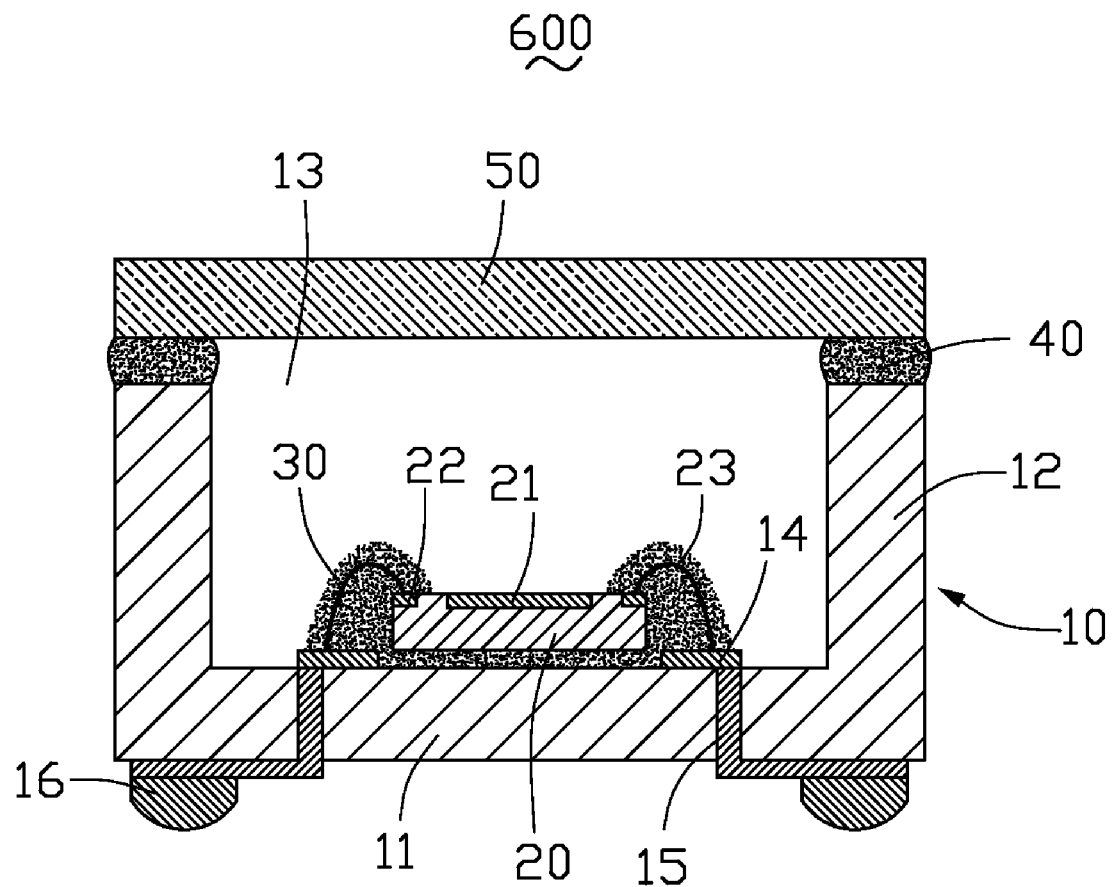
FIG. 6 is a schematic, cross-sectional view of a typical image package.

Referring to FIG. 5, an image sensing module 500 in accordance with a fifth preferred embodiment of the present invention is provided. Similarly to the image sensing module 100, the image sensing module 500 includes an image sensor package 510, a subsidiary adhesive 520 and a lens module 530. The lens module includes a lens group 532 and a lens holder 533. These components of the image sensing module 500 are similar to their corresponding components of the image sensing module 100. The image sensing module 500 differs from the image sensing module 100 mainly in the structure of the supporter 513 and the way of mounting the lens holder 533.

The image sensor package 510 includes a supporter 513, the supporter 513 includes a top surface 513a, and a protruding frame 513e is formed on the top surface 513a. A certain distance separates the protruding frame 513e and an outer periphery of the supporter 513, and a mounting surface 513f is defined on the top surface 513a between the protruding frame 513e and an outer periphery of the supporter 513. A plurality of top pads 513c are formed on the top surface 513a inside the protruding frame 513e.

The lens holder 533 includes a pedestal 533c whose dimensions are approximately equal to that of the supporter 513. The subsidiary adhesive 520 is applied on the mounting surface 513f. The pedestal 533c covers the image sensor package 510, an inner surface of the pedestal 533c tightly contacts with an outer surface of the protruding frame 513e. The pedestal 533c is mounted on the mounting surface 513f of the supporter 513 via the subsidiary adhesive 520.

Understandably, in assembly of the image sensing module 500, the protruding frame 513e of the supporter 513 can cooperate with the pedestal 533c to improve assembling precision of the image sensing module 500.

It is to be understood, however, that even though numerous characteristics and advantages of the present invention have been set forth in the foregoing description, together with details of the structure and function of the present invention, the disclosure is illustrative only, and changes may be made in detail, especially in matters of shape, size, and arrangement of parts within the principles of present invention to the full extent indicated by the broad general meaning of the terms in which the appended claims are expressed.

What is claimed is:

1. An image sensing module, comprising:
an image sensor package, the image sensor package including a base board, a supporter, an image sensor module, a plurality of wires, a main adhesive and a cover board; the supporter including a through hole, a top surface, a stepped surface and a plurality of top pads formed around the through hole, the stepped surface positioned near a central portion of the supporter and lower than the top surface, the top pads formed on the stepped surface, and the supporter being mounted on the base board and electrically connected to the base board; the image sensor being mounted on the base board and received in the through hole, and the image sensor including a sensing portion and a plurality of contacts; the wires electrically connecting the top pads to the contacts; the main adhesive being formed on the image sensor; the cover board and the main adhesive cooperatively packaging the sensing portion of the image sensor; and
a lens module connected to the image sensor package, the lens module including a pedestal covering around the supporter, an inner surface of the pedestal tightly contacting with the supporter.

2. The image sensing module as claimed in claim 1, wherein the image sensing module includes a subsidiary adhesive, and the lens module includes a lens holder and a lens group mounted in the lens holder, and the lens module is connected to the image sensor package via the subsidiary adhesive.

3. The image sensing module as claimed in claim 2, wherein the lens group includes at least one lens, a barrel and a filter, the lens and the filter are mounted in the barrel.

4. The image sensing module as claimed in claim 3, wherein the lens holder includes a top board; a hole is defined on a central portion of the top board; and the pedestal is formed on a peripheral portion of the top board; the top board cooperates with the pedestal to define a receiving space, the image sensor package is received in the receiving space.

5. The image sensing module as claimed in claim 4, wherein the subsidiary adhesive is applied on a peripheral portion of the base board, and the pedestal is mounted on the base board via the subsidiary adhesive.

6. An image sensing module, comprising:
an image sensor package, comprising:
a base board;
a supporter including a through hole, a top surface, a protruding frame and a plurality of top pads formed around the through hole, the protruding frame formed on the top surface to divide the top surface into an inner section and an outer section at opposite sides of the protruding frame, the top pads formed on the inner section, and the supporter being mounted on the base board and electrically connected to the base board;
an image sensor being mounted on the base board and received in the through hole, and the image sensor including a sensing portion and a plurality of contacts;
a plurality of wires electrically connecting the top pads to the contacts;
a main adhesive applied on the image sensor and surrounding the sensing portion; and
a cover board supported on the main adhesive, the cover board and the main adhesive cooperatively enclosing the sensing portion of the image sensor; and
a lens module connected to the image sensor package, the lens module including the pedestal covering the image sensor package, an inner surface of the pedestal tightly contacting with an outer surface of the outer section of the protruding frame.

* * * * *